(12) United States Patent
Ji et al.

(10) Patent No.: US 11,477,891 B2
(45) Date of Patent: Oct. 18, 2022

(54) ELECTRONIC COMPONENT

(71) Applicant: SAMSUNG ELECTRO-MECHANICS CO., LTD., Suwon-si (KR)

(72) Inventors: Gu Won Ji, Suwon-si (KR); Man Su Byun, Suwon-si (KR); Soo Hwan Son, Suwon-si (KR); Young Ghyu Ahn, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 198 days.

(21) Appl. No.: 16/990,272

(22) Filed: Aug. 11, 2020

(65) Prior Publication Data

US 2021/0092847 A1  Mar. 25, 2021

(30) Foreign Application Priority Data

Sep. 20, 2019 (KR) .................. 10-2019-0116377

(51) Int. Cl.
*H01G 4/12* (2006.01)
*H01G 4/242* (2006.01)
(Continued)

(52) U.S. Cl.
CPC ........... *H05K 1/181* (2013.01); *H01G 4/1227* (2013.01); *H01G 4/242* (2013.01); *H01G 4/30* (2013.01);
(Continued)

(58) Field of Classification Search
CPC ...... H01G 4/005; H01G 4/1227; H01G 4/232; H01G 4/242; H01G 4/30; H01G 4/38; H01G 4/12; H05K 1/0216; H05K 1/111; H05K 1/181; H05K 1/11; H05K 1/18; H05K 2201/10015; H05K 2201/10522
(Continued)

(56) References Cited

U.S. PATENT DOCUMENTS

| 6,058,004 A | * | 5/2000 | Duva .................. H01G 4/38 |
| | | | 361/328 |
| 2008/0189931 A1 | * | 8/2008 | Bultitude ............... H05K 3/301 |
| | | | 29/827 |

(Continued)

FOREIGN PATENT DOCUMENTS

| CN | 104124058 A | 10/2014 | |
| JP | 09115773 A | * 5/1997 | ............... H01G 4/12 |

(Continued)

OTHER PUBLICATIONS

Chinese Office Action dated Jul. 25, 2022, issued in corresponding Chinese Patent Application No. 202010949248.8.

*Primary Examiner* — Timothy J Thompson
*Assistant Examiner* — Guillermo J Egoavil
(74) *Attorney, Agent, or Firm* — Morgan, Lewis & Bockius LLP

(57) ABSTRACT

An electronic component includes a substrate including electrode pads disposed on an upper surface; and a plurality of multilayer capacitors mounted on the substrate and including external electrodes connected to the electrode pads. At least one multilayer capacitor among the plurality of multilayer capacitors is a multilayer capacitor of a horizontally stacked structure.

13 Claims, 15 Drawing Sheets

(51) Int. Cl.
*H01G 4/30* (2006.01)
*H05K 1/11* (2006.01)
*H05K 1/18* (2006.01)

(52) U.S. Cl.
CPC .... *H05K 1/111* (2013.01); *H05K 2201/10015* (2013.01); *H05K 2201/10522* (2013.01)

(58) Field of Classification Search
USPC ...... 174/260; 361/301.4, 321.5, 321.4, 321.2
See application file for complete search history.

(56) References Cited

U.S. PATENT DOCUMENTS

| | | | |
|---|---|---|---|
| 2009/0147440 A1* | 6/2009 | Cygan | H01G 4/38 361/306.3 |
| 2010/0033938 A1* | 2/2010 | Kitagawa | H05K 1/0231 361/748 |
| 2014/0318842 A1 | 10/2014 | Han et al. | |
| 2015/0187502 A1 | 7/2015 | Hwang | |
| 2016/0196922 A1 | 7/2016 | Omori et al. | |
| 2016/0309578 A1* | 10/2016 | Park | H01G 4/232 |

FOREIGN PATENT DOCUMENTS

| | | |
|---|---|---|
| KR | 10-1545410 B1 | 8/2015 |
| KR | 10-1652313 B1 | 9/2016 |

\* cited by examiner

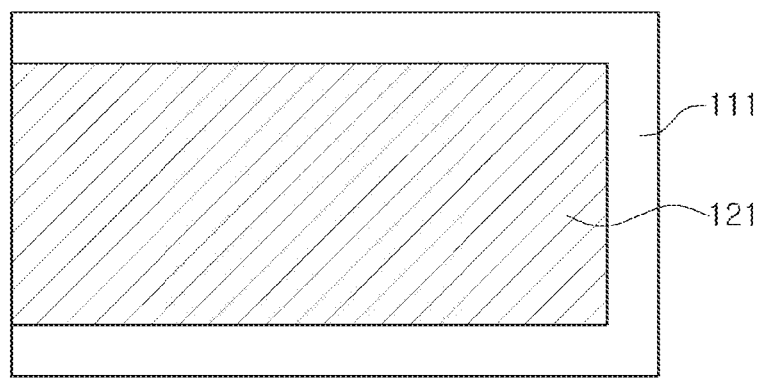
FIG. 2A
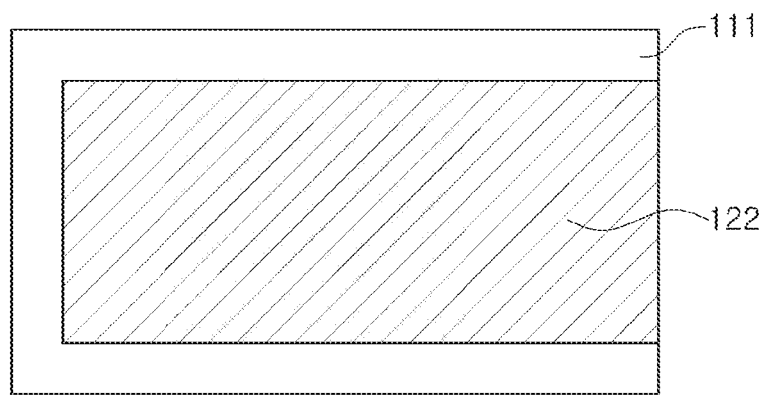
FIG. 2B
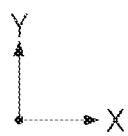

ELECTRONIC COMPONENT

CROSS-REFERENCE TO RELATED APPLICATION

This application claims the benefit of Korean Patent Application No. 10-2019-0116377 filed on Sep. 20, 2019, with the Korean Intellectual Property Office, the disclosure of which is incorporated herein by reference.

BACKGROUND

The present disclosure relates to an electronic component.

As an electronic component, a multilayer capacitor is made of a dielectric material, and since the dielectric material has piezoelectricity, it can be deformed in synchronization with an applied voltage.

When a period of the applied voltage is within an audible frequency band, such displacement may become vibrations and may be transmitted to a substrate through a solder, and the vibrations of the substrate may be experienced as sound. This sound is known as acoustic noise.

Such acoustic noise may be perceived as a malfunction of a device by a user as an abnormal sound when an operating environment of the device is quiet.

In addition, in a device having a voice circuit, the acoustic noise may be superimposed on a voice output to reduce a quality of the device.

In addition, apart from acoustic noise perceived by human ears, when piezoelectric vibrations of the multilayer capacitor are generated in a high frequency region of 20 kHz or more, it may cause malfunctioning of various sensors used in IT and industrial/electrical device fields.

SUMMARY

An aspect of the present disclosure is to provide an electronic component capable of reducing acoustic noise in an audible frequency region of less than 20 kHz and a high frequency vibration of 20 kHz or more.

According to an aspect of the present disclosure, an electronic component includes a substrate including electrode pads disposed on an upper surface; and a plurality of multilayer capacitors mounted on the substrate and including external electrodes connected to the electrode pads. At least one multilayer capacitor among the plurality of multilayer capacitors is a multilayer capacitor having a horizontally layered structure.

In an embodiment of the present disclosure, a total of four or more multilayer capacitors may be included.

In an embodiment of the present disclosure, a plurality of multilayer capacitors may be disposed adjacent to each other in a line on the substrate.

In an embodiment of the present disclosure, the number of the plurality of multilayer capacitors may be a total of four.

In an embodiment of the present disclosure, one of two multilayer capacitors among the plurality of multilayer capacitors disposed in a center portion of the plurality of multilayer capacitors may be a multilayer capacitor having a horizontally stacked structure.

In an embodiment of the present disclosure, the substrate provides spaces in a 1×4 array, and the plurality of multilayer capacitors are respectively disposed only in three compartments of the 1×4 array.

In an embodiment of the present disclosure, the number of the plurality of multilayer capacitors may be a total of four, and the plurality of multilayer capacitors may be disposed adjacent to a square shape on the substrate.

In an embodiment of the present disclosure, the number of the plurality of multilayer capacitors are a total of four, and the plurality of multilayer capacitors may be disposed adjacent to each other in rectangle form on the substrate.

In an embodiment of the present disclosure, the plurality of multilayer capacitors may be disposed in a 2×2 array.

In an embodiment of the present disclosure, in the plurality of multilayer capacitors, the number of multilayer capacitors having a vertically stacked structure may be greater than the number of multilayer capacitors having the horizontally stacked type.

In an embodiment of the present disclosure, the horizontally stacked structure may include internal electrodes disposed horizontally with respect to the upper surface of the substrate and stacked on each other in a vertical direction with respect to the upper surface of the substrate. The vertically stacked structure may include internal electrodes disposed vertically with respect to the upper surface of the substrate and stacked on each other in a horizontally direction with respect to the upper surface of the substrate. For example, "horizontally stacked" may mean that internal electrodes are laminated parallel to a mounting surface (i.e., main surfaces of the internal electrodes face a circuit board when mounted), and "vertically stacked" may mean that internal electrodes are laminated vertical to a mounting surface (i.e., main surfaces of the internal electrodes face a sideway with respect to a mounting surface when mounted).

In an embodiment of the present disclosure, each of the plurality of multilayer capacitors may include a body and first and second external electrodes respectively disposed on both ends of the body in a first direction. The body may include a dielectric layer and the internal electrodes alternately disposed with the dielectric layer interposed therebetween.

In an embodiment of the present disclosure, the external electrodes may include first and second head portions disposed on both end surfaces of the body of the multilayer capacitor in the first direction, respectively, and first and second band portions extending from the first and second head portions onto portions of upper and lower surfaces and portions of both side surfaces of the body, respectively.

In an embodiment of the present disclosure, the horizontally stacked structure may include internal electrodes disposed horizontally with respect to the upper surface of the substrate and stacked on each other in a vertical direction with respect to the upper surface of the substrate.

According to an aspect of the present disclosure, an electronic component includes a substrate including electrode pads disposed on an upper surface; and a plurality of multilayer capacitors mounted on the substrate and including external electrodes connected to the electrode pads. The plurality of multilayer capacitor may include one or more multilayer capacitors each having a vertically stacked structure and one or more multilayer capacitors each having a horizontally stacked structure. The horizontally stacked structure may include internal electrodes disposed horizontally with respect to the upper surface of the substrate and stacked on each other in a vertical direction with respect to the upper surface of the substrate. The vertically stacked structure may include internal electrodes disposed vertically with respect to the upper surface of the substrate and stacked on each other in a horizontally direction with respect to the upper surface of the substrate.

In an embodiment of the present disclosure, the plurality of multilayer capacitors may be disposed in a 1×N (N≥3) array.

In an embodiment of the present disclosure, the plurality of multilayer capacitors may be disposed in a 1×4 array.

In an embodiment of the present disclosure, the plurality of multilayer capacitors may be disposed in a 2×2 array.

BRIEF DESCRIPTION OF DRAWINGS

The above and other aspects, features and other advantages of the present disclosure will be more clearly understood from the following detailed description taken in conjunction with the accompanying drawings, in which:

FIGS. 2A and 2B are plan views illustrating first and second internal electrodes, respectively, applied to the first multilayer capacitor of FIG. 1;

DETAILED DESCRIPTION

Figure 1:
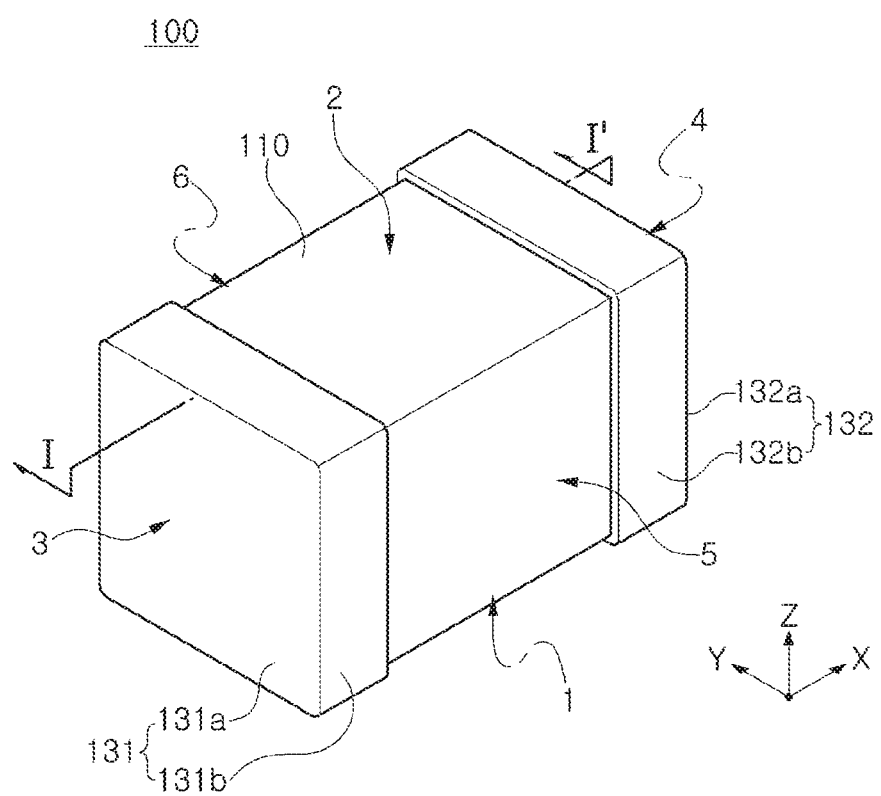
FIG. 1 is a schematic perspective view of a first multilayer capacitor having a horizontally stacked structure applied to an embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein.

Rather, these embodiments are provided so that this disclosure will be through and complete, and will fully convey the scope of the disclosure to those skilled in the art.

Accordingly, shapes and sizes of elements in the drawings may be exaggerated for clarity of description, and elements indicated by the same reference numeral are same elements in the drawings.

In addition, the same reference numerals are used throughout the drawings for parts having similar functions.

Throughout the specification, when a component is referred to as "comprise" or "comprising," it means that it may include other components as well, rather than excluding other components, unless specifically stated otherwise.

When directions are defined to clearly describe the embodiments of the present disclosure, X, Y, and Z shown in the drawings indicate a length direction, a width direction, and a thickness direction of a multilayer capacitor, respectively.

Figure 3:
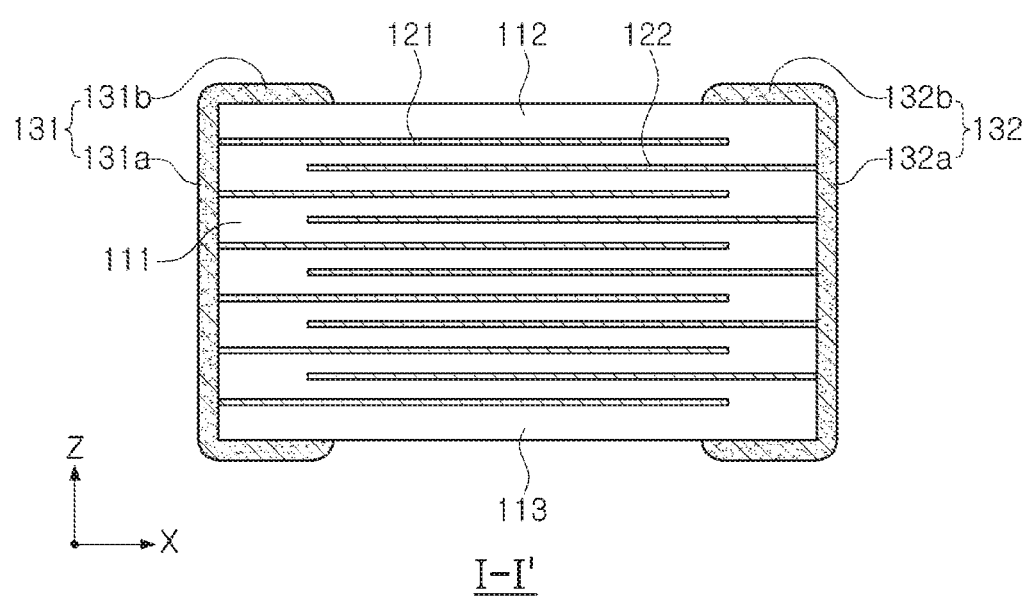
FIG. 3 is a cross-sectional view taken along line I-I' of FIG. 1.

FIG. 1 is a schematic perspective view of a first multilayer capacitor having a horizontally stacked structure applied to an embodiment of the present disclosure, FIGS. 2A and 2B are plan views illustrating first and second internal electrodes, respectively, applied to the first multilayer capacitor of FIG. 1, and FIG. 3 is a cross-sectional view taken along line I-I' of FIG. 1.

First, referring to FIG. 1, a structure of a first multilayer capacitor applied to an electronic component of the present embodiment will be described.

Referring to FIGS. 1 and 3 together, a first multilayer capacitor 100 of the present embodiment includes a body 110 and first and second external electrodes 131 and 132 respectively disposed on both end portions of the body 110 in the X direction, a first direction.

The body 110 is formed by laminating a plurality of dielectric layers 111 in the Z direction and then firing the plurality of dielectric layers 111, and a boundary between adjacent dielectric layers 111 of the capacitor body 110 may be integrated, such that it may be difficult to confirm without using a scanning electron microscope (SEM).

In addition, the body 110 includes a plurality of dielectric layers 111 and first and second internal electrodes 121 and 122 having different polarities, alternately disposed in the Z direction with the dielectric layers 111 interposed therebetween.

In addition, the body 110 may include an active region serving as a part contributing to capacitance formation of the capacitor and cover regions 112 and 113 provided in upper and lower portions of the active region in the Z direction, respectively, as margin portions.

Although the shape of the body 110 is not particularly limited, it may be a hexahedral shape. The body 110 may have first and second surfaces 1 and 2 opposing each other in the Z direction, third and fourth surfaces 3 and 4 connected to the first and second surfaces 1 and 2, and opposing each other in the X direction, and fifth and sixth surfaces 5 and 6 connected to the first and second surfaces 1 and 2, connected to the third and fourth surfaces 3 and 4, and opposing each other in the W direction.

The dielectric layer 111 may include ceramic powder, for example, $BaTiO_3$-based ceramic powder, or the like.

The $BaTiO_3$-based ceramic powder may be, for example, $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like is partially dissolved in $BaTiO_3$, and the present disclosure is not limited thereto.

In addition, a ceramic additive, an organic solvent, a plasticizer, a binder, a dispersant, and the like, may further be added to the dielectric layer 111, together with the ceramic powder.

The ceramic additive, may be, for example, a transition metal oxide or a transition metal carbide, a rare earth element, magnesium (Mg), aluminum (Al), or the like.

The first multilayer capacitor 100 of the present embodiment has a horizontally stacked structure, and the first and second internal electrodes 121 and 122 are electrodes to which different polarities are applied, and may be formed on the dielectric layer 111 and laminated in the Z direction. The first and second internal electrodes 121 and 122 may be alternately disposed in the body 110 to oppose each other with the dielectric layer 111 interposed therebetween in the Z direction.

In this case, the first and second internal electrodes 121 and 122 may be electrically insulated from each other by the dielectric layer 111 disposed in a middle position.

One ends of the first and second internal electrodes 121 and 122 may be exposed through the third and fourth surfaces 3 and 4 of the body 110, respectively.

The end portions of the first and second internal electrodes 121 and 122 alternately exposed through the third and fourth surfaces 3 and 4 of the body 110 may be respectively connected to first and second external electrodes 131 and 132 disposed at both end portions of the body 110 in the X direction to be described later and may be electrically connected.

According to the above-described configuration, when a predetermined voltage is applied to the first and second external electrodes 131 and 132, charges are accumulated between the first and second internal electrodes 121 and 122.

In this case, capacitance of the first multilayer capacitor 100 is proportional to an area of overlap of the first and second internal electrodes 121 and 122 superimposed on each other in the Z direction in the active region.

In addition, a material for forming the first and second internal electrodes 121 and 122 is not particularly limited, and may be a noble metal material such as platinum (Pt), palladium (Pd), palladium-silver (Pd—Ag) alloys, and the like, or a conductive paste formed of one or more materials of nickel (Ni) and copper (Cu).

In this case, as a printing method of the conductive paste, a screen-printing method, a gravure printing method, or the like, may be used, but the present disclosure is not limited thereto.

First and second external electrodes 131 and 132 may be provided with voltages of different polarities, may be disposed at both end portions of the body 110 in the X direction, and may be respectively connected to the exposed end portions of the first and second internal electrodes 121 and 122 to be electrically connected.

The first external electrode 131 may include a first head portion 131a and a first band portion 131b.

The first head portion 131a may be disposed on the third surface 3 of the body 110, and may serve to electrically connect the first internal electrode 121 and the first external electrode 131 to each other in contact with the end portion exposed to an outside through the third surface 3 of the body 110 from the first internal electrode 121.

The first band portion 131b may be a portion extending from the first head portion 131a to portions of the first, second, fifth, and sixth surfaces 1, 2, 5, and 6 of the body 110.

The second external electrode 132 may include a second head portion 132a and a second band portion 132b.

The second head portion 132a may be disposed on the fourth surface 4 of the body 110, and may serve to electrically connect the second internal electrode 122 and the second external electrode 132 to each other in contact with the end portion exposed to an outside through the fourth surface 4 of the body 110 from the second internal electrode 122.

The second band portion 132b is a portion extending from the second head portion 132a to portions of the first, second, fifth, and sixth surfaces 1, 2, 5, and 6 of the body 110 in order to improve a fixing strength, or the like.

Meanwhile, the first and second external electrodes 131 and 132 may further include a plating layer.

The plating layer may include first and second nickel (Ni) plating layers respectively covering surfaces of the first and second external electrodes 131 and 132 and first and second tin (Sn) plating layers respectively covering the first and second nickel plating layers.

Figure 4A:
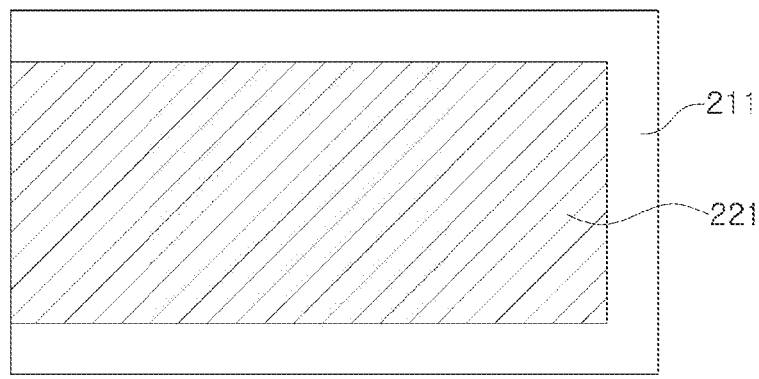
FIGS. 4A and 4B are plan views illustrating third and fourth internal electrodes, respectively, in a second multilayer capacitor having a vertically stacked structure, applied to an embodiment of the present disclosure.
Figure 4B:
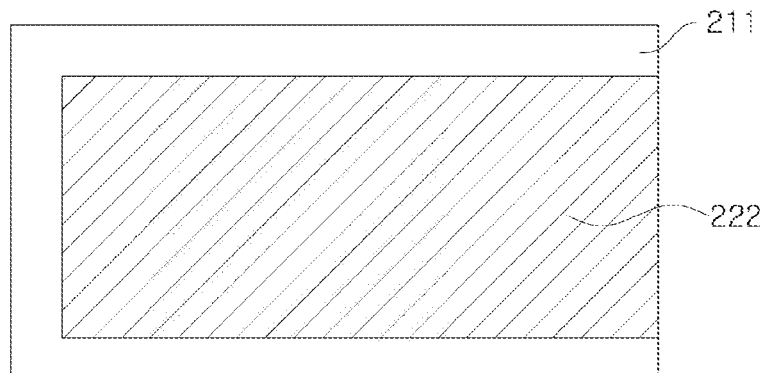
Figure 5:
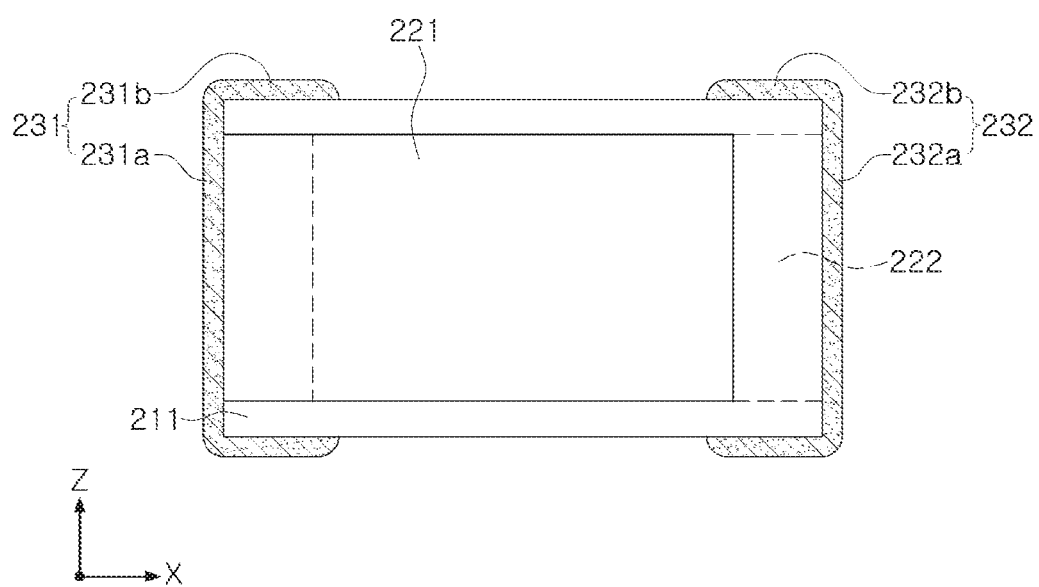
FIG. 5 is a cross-sectional view of a second multilayer capacitor.

FIGS. 4A and 4B are plan views illustrating third and fourth internal electrodes in a second multilayer capacitor having a vertically stacked structure, applied to an embodiment of the present disclosure, respectively, and FIG. 5 is a cross-sectional view of a second multilayer capacitor.

Here, a portion similar to the structure of the above-described embodiment such as a structure in which third and fourth external electrodes 231 and 232 are formed, will not be described in detail so as to avoid duplication, and third and fourth internal electrodes 221 and 222 having a structure different from that of the above-described embodiment will be illustrated and described in detail based thereon.

Referring to FIGS. 4A to 5, in the second multilayer capacitor having the vertically stacked structure of the present embodiment, a body 210 includes a plurality of dielectric layers 211 and third and fourth internal electrodes 221 and 222 having different polarities, alternately disposed in the Y direction with the dielectric layers 211 interposed therebetween.

The third and fourth internal electrodes 221 and 222 are electrodes to which different polarities are applied, may be formed on the dielectric layers 211 and stacked in the Y direction, and may be alternately disposed to oppose each other in the Y direction inside the body 210 with one dielectric layer 211 interposed therebetween.

The third external electrode 231 may include a third head portion 231a connected to the third internal electrode 221 and a third band portion 231b extending from the third head portion 231a to portions of the second, fifth, and sixth surfaces of the body 210.

The fourth external electrode 232 may include a fourth head portion 232a connected to the fourth internal electrode 222 and a fourth band portion 232b extending from the fourth head portion 232a to portions of the second, fifth, and sixth surfaces of the body 210.

An electronic component of the present disclosure includes a substrate including a plurality of electrode pads disposed on an upper surface thereof, and a plurality of multilayer capacitors mounted to connect external electrodes to the electrode pads. At least one multilayer capacitor becomes a second multilayer capacitor having a vertically stacked structure.

In this case, preferably, in the plurality of multilayer capacitors, the number of the first multilayer capacitors having a horizontally stacked structure may be less than the number of the second multilayer capacitors of a vertically stacked type.

In addition, a total number of multilayer capacitors included in the electronic component may preferably be four or more.

Figure 6:
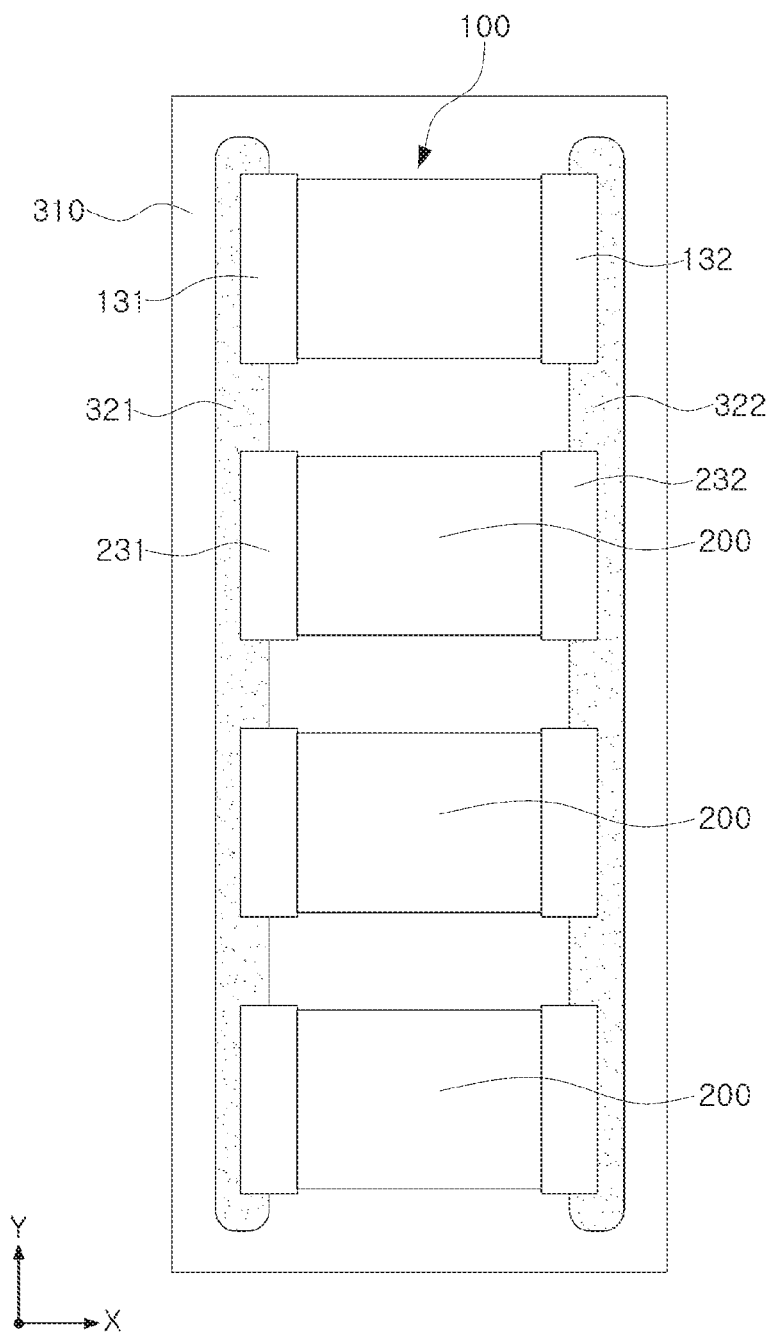
FIG. 6 is a perspective view illustrating a schematic structure of an electronic component according to an embodiment of the present disclosure.

FIG. 6 is a perspective view illustrating a schematic structure of an electronic component according to an embodiment of the present disclosure.

In addition, the electronic component of the present embodiment may include a substrate 310 and one first multilayer capacitor 100 having a horizontally stacked structure mounted on the upper surface of the substrate 310 and three second multilayer capacitors 200 having a vertically stacked structure.

In addition, in the present embodiment, the plurality of multilayer capacitors may be disposed adjacent to each other in a line on the substrate.

In this case, the first multilayer capacitor 100 and the plurality of second multilayer capacitors 200 may be disposed in a line in the Y direction on the substrate 310.

In the present embodiment, one first multilayer capacitor 100 may be disposed at the top in the drawing, and three second multilayer capacitors 200 may be disposed below the first multilayer capacitor 100 side by side.

In this case, a first electrode pad 321 and a second electrode pad 322 may be formed on the substrate 310 at a predetermined interval in the X direction, respectively.

In addition, the third external electrode 231 of the plurality of second multilayer capacitors 200 and the first external electrode 131 of the first multilayer capacitor 100 may be disposed on and be connected to the first electrode pad 321 at predetermined intervals.

In addition, the fourth external electrode 232 of the plurality of second multilayer capacitors 200 and the second external electrode 132 of the first multilayer capacitor 100 may be disposed on and connected to the second electrode pad 322 at predetermined intervals.

Alternatively, one of the two multilayer capacitors disposed in a center portion of the substrate 310 may be the first multilayer capacitor 100 having a horizontally stacked structure.

The electronic component of the present embodiment may be modified to have various dispositional structures.

Figure 8A:
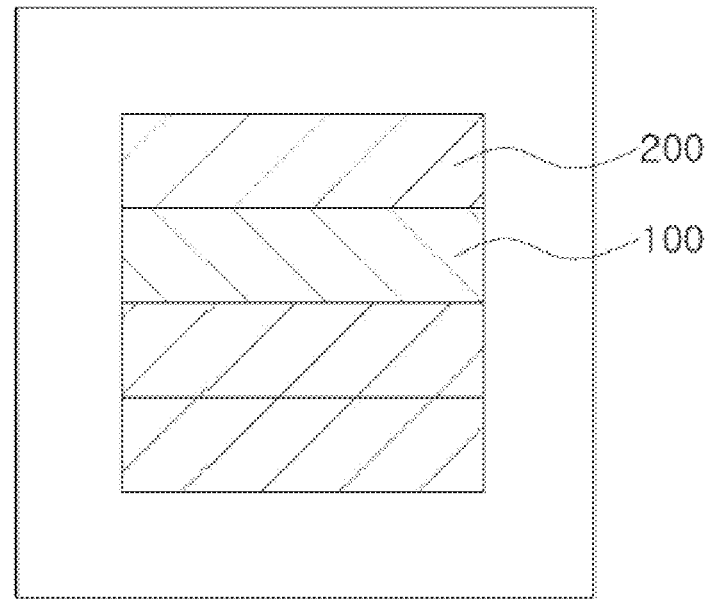
FIGS. 8A to 14 are schematic diagrams conceptually illustrating various embodiments of the electronic component of the present disclosure in which a plurality of multilayer capacitors are disposed in straight line form.

For example, the second multilayer capacitor 200 may be disposed in a first order, the first multilayer capacitor 100 may be disposed in a second order, and the second multilayer capacitor 200 may be disposed in third and fourth orders, from the top to the bottom in the view shown in FIG. 8A.

Figure 9:
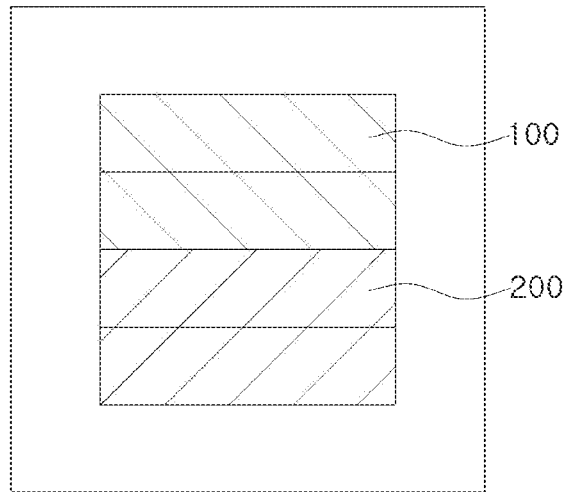

Alternatively, the first multilayer capacitor 100 may be disposed in the first and second orders, respectively, and the second multilayer capacitor 200 may be disposed in the third and fourth orders, respectively, from the top to the bottom in the view shown in FIG. 9.

Figure 10:
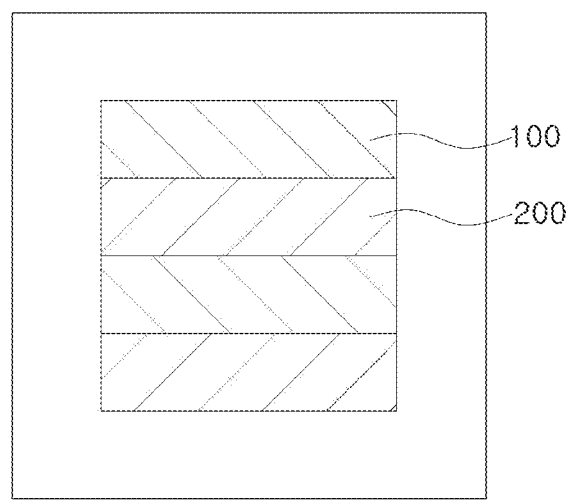

Alternatively, the first multilayer capacitor 100 may be disposed in the first and third orders, respectively, and the second multilayer capacitor 200 may be disposed in the second and fourth orders, respectively, from the top to the bottom in the view shown in FIG. 10.

Figure 11:
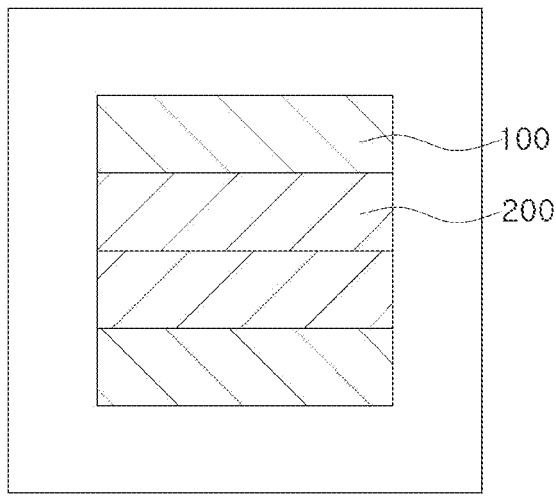

Alternatively, the first multilayer capacitor 100 may be disposed in the first and fourth orders, respectively, and the second multilayer capacitor 200 may be disposed in the second and third orders, respectively, from the top to the bottom in the view shown in FIG. 11.

Figure 12:
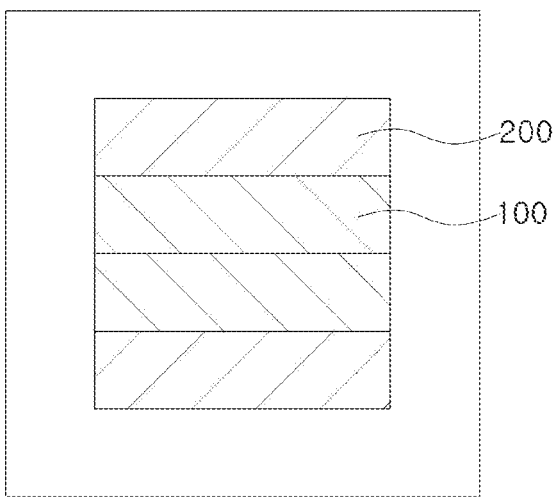

Alternatively, the first multilayer capacitor 100 may be disposed in the second and third orders, respectively, and the second multilayer capacitor 200 may be disposed in the first and fourth orders, respectively, from the top to the bottom in the view shown in FIG. 12.

Figure 13:
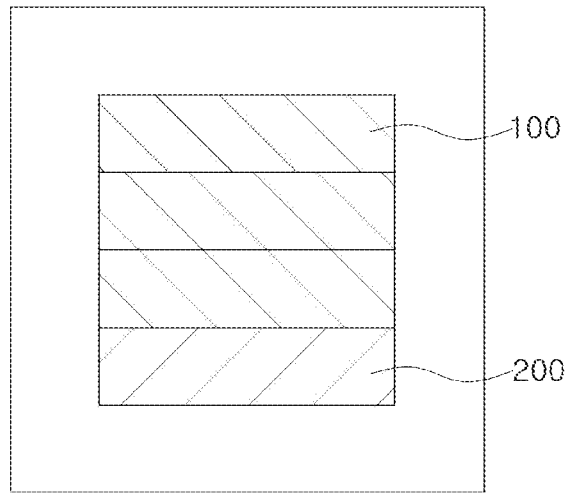

Alternatively, the first multilayer capacitor 100 may be disposed in the first, second, and third orders respectively, and the second multilayer capacitor 200 may be disposed in the fourth order, from the top to the bottom in the view shown in FIG. 13.

Figure 14:
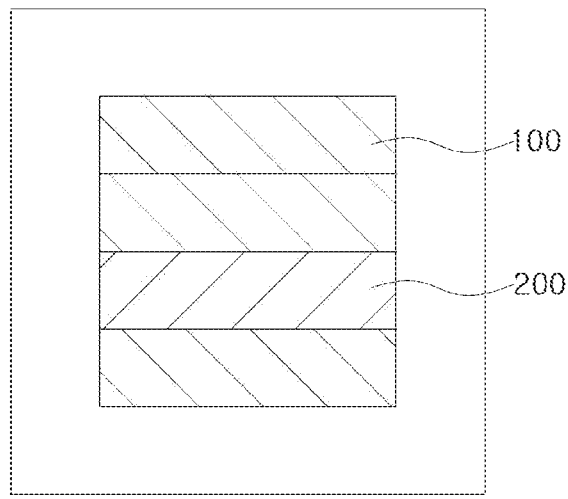

Alternatively, the second multilayer capacitor 200 may be disposed in the first, second, and fourth orders, respectively, and the first multilayer capacitor 100 may be disposed in the third order, from the top to the bottom in the view shown in FIG. 14.

Table 1 below shows a comparison of acoustic noise of Comparative Example and various Examples of the present disclosure.

Figure 7:
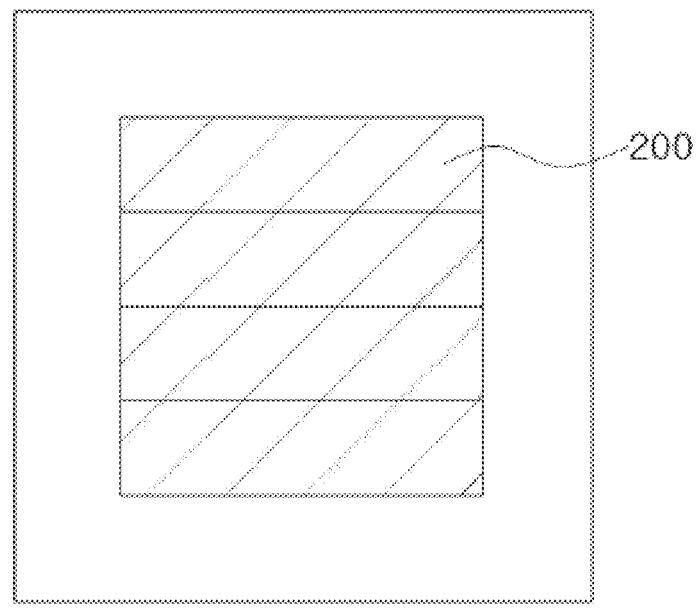
FIG. 7 is a schematic diagram conceptually illustrating an electronic component of Comparative Example in which the first multilayer capacitor having a plurality of vertically stacked structures is disposed in straight line form.
Figure 15:
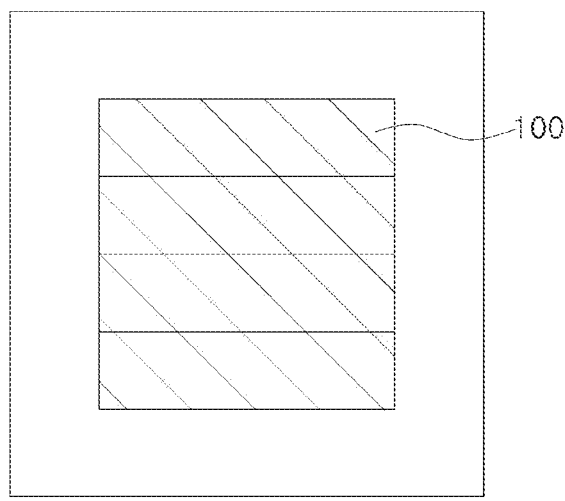
FIG. 15 is a schematic diagram conceptually illustrating an electronic component of Comparative Example in which a second multilayer capacitor of a plurality of horizontally stacked structures is disposed in straight line form.

REF is for one first multilayer capacitor, Comparative Example 1 shows an electronic component only comprised of the second multilayer capacitor having the vertically stacked structure shown in FIG. 7, and Comparative Example 2 shows an electronic component only comprised of the first multilayer capacitor having the horizontally stacked structure shown in FIG. 15.

In addition, Example 1 shows a structure shown in FIG. 6, Example 2 shows a structure shown in FIG. 8A, Example 3 shows a structure shown in FIG. 9, Example 4 shows a structure shown in FIG. 10, Example 5 shows a structure shown in FIG. 11, Example 6 shows a structure shown in FIG. 12, Example 7 shows a structure shown in FIG. 13, and Example 8 shows a structure shown in FIG. 14.

TABLE 1

| | Acoustic Noise (dB) | | | | | | | | |
|---|---|---|---|---|---|---|---|---|---|
| | Sample 1 | Sample 2 | Sample 3 | Sample 4 | Sample 5 | Average | Minimum | Maximum | Standard deviation |
| REF | 34.5 | 34 | 33.9 | 35.2 | 33.4 | 34.2 | 33.4 | 35.2 | 0.7 |
| CE1 | 30.8 | 32.3 | 31.1 | 31.5 | 30.5 | 31.2 | 30.5 | 32.3 | 0.7 |
| CE2 | 39.6 | 39.7 | 39.8 | 39.7 | 39.9 | 39.7 | 39.6 | 39.9 | 0.4 |
| Example 1 | 21.8 | 20.2 | 21.4 | 21 | 20.3 | 20.9 | 20.2 | 21.8 | 0.7 |
| Example 2 | 18.8 | 17.8 | 19.1 | 18.1 | 17.5 | 18.3 | 17.5 | 19.1 | 0.7 |
| Example 3 | 30.6 | 30.5 | 30.3 | 29.4 | 30.7 | 30.3 | 29.4 | 30.7 | 0.5 |
| Example 4 | 30 | 30.4 | 30.7 | 30.3 | 30 | 30.3 | 30 | 30.7 | 0.3 |
| Example 5 | 28.7 | 28.6 | 29.2 | 29.2 | 29.5 | 29 | 28.6 | 29.5 | 0.4 |
| Example 6 | 32.2 | 32.1 | 31.3 | 31.6 | 31.9 | 31.8 | 31.3 | 32.2 | 0.4 |
| Example 7 | 36.3 | 36.7 | 36.2 | 36.5 | 37.2 | 36.6 | 36.2 | 37.2 | 0.4 |
| Example 8 | 35.9 | 36 | 35.4 | 35.7 | 35.7 | 35.7 | 35.4 | 36 | 0.2 |

*CE1 and CE2: Comparative Examples

Referring to Table 1, in Comparative Example 1, which shows an electronic component only comprised of a second multilayer capacitor having a vertically stacked structure, an average value of acoustic noise was 31.2 dB.

In Comparative Example 2, which shows an electronic component only comprised of a first multilayer capacitor having a horizontally stacked structure, an average value of acoustic noise was 39.7 dB, which is much higher than that of Comparative Example 1.

That is, in general, it can be seen that the first multilayer capacitor having the horizontally stacked structure has a higher piezoelectric vibration than the second stacked capacitor having the vertically stacked structure, and thus the acoustic noise is also high.

In Examples 1 and 2 including one first multilayer capacitor having a horizontally stacked structure, it can be seen that the average values of acoustic noise are 20.9 dB and 18.3 dB, respectively, which are lower than those of Comparative Example 2 and Comparative Example 1.

Example 1 shows that the first multilayer capacitor is disposed at an upper end thereof to be adjacent to one second multilayer capacitor, and Example 2 shows that the first multilayer capacitor is disposed in the center to be adjacent to the two second multilayer capacitors above and below. In Example 2, it is determined that the acoustic noise is further reduced since a physical wave offset effect is greater than that of Example 1.

In Examples 3 to 6 including two first multilayer capacitors having a horizontally stacked structure, an average value of the acoustic noise of Example 3 was 30.3 dB, an average value of the acoustic noise of Example 4 was 30.3 dB, an average value of the acoustic noise of Example 5 was 29 dB, and an average value of the acoustic noise of Example 6 was 31.8 dB.

Therefore, in Examples 3 to 5, the average value of acoustic noise was lower than that of Comparative Example 1 and Comparative Example 2, but in Example 6, the average value of acoustic noise was higher than that of Comparative Example 1, while the average value of acoustic noise was lower than that of Comparative Example 2.

In addition, even in Examples 3 to 5, the average value of the acoustic noise did not show a large difference as compared with Comparative Example 1.

In Examples 7 and 8 including three first multilayer capacitors having a horizontally stacked structure, an average value of the acoustic noise of Example 7 was 36.6 dB, and an average value of the acoustic noise of Example 8 was 35.7 dB.

Therefore, in Examples 7 and 8, the average value of the acoustic noise was lower than that of Comparative Example 2, but higher than that of Comparative Example 1.

As a result, in forming an electronic component disposed in a row with a plurality of multilayer capacitors, when both the first multilayer capacitor and the second multilayer capacitor are included, it can be seen that acoustic noise is lower than that of the electronic component only comprised of the second multilayer capacitor.

In this case, preferably, the number of the second multilayer capacitors may be greater than the number of the first multilayer capacitors.

Figure 8B:
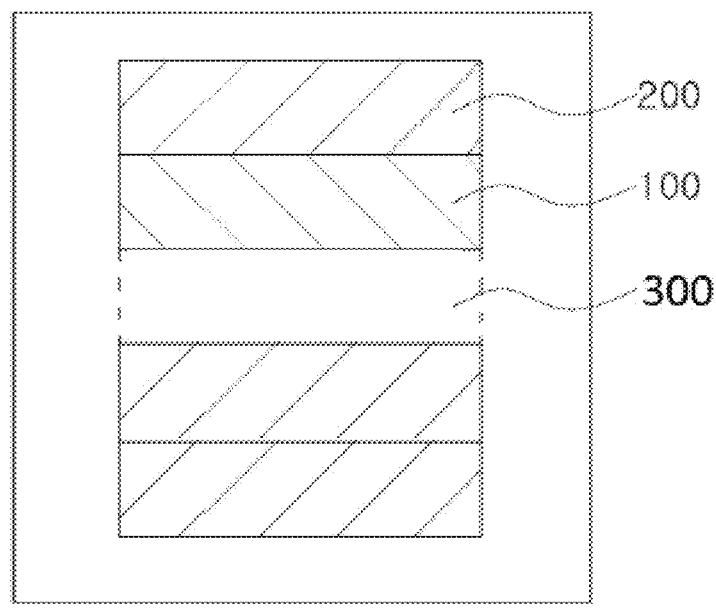
Figure 8C:
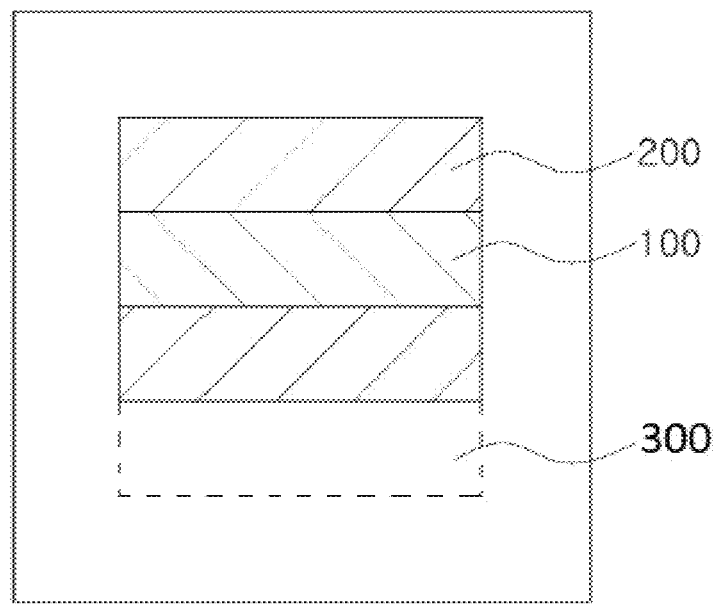

Meanwhile, in the present disclosure, four multilayer capacitors may be disposed in a line, and an empty space may be provided in the middle of the multilayer capacitors adjacent to each other as shown in FIG. 8B, or an electronic component may be configured as a structure only comprised of three multilayer capacitors without mounting a multilayer capacitor at one of end portions in the Y direction in the drawing as shown in FIG. 8C.

For example, a plurality of multilayer capacitors may be disposed in a 1×4 array, and one compartment 300 thereof shown in FIGS. 8B and 8C may be a space portion in which the multilayer capacitors are not disposed.

In this case, preferably, when only one first multilayer capacitor is included, it may be more effective in reducing acoustic noise.

Figure 16:
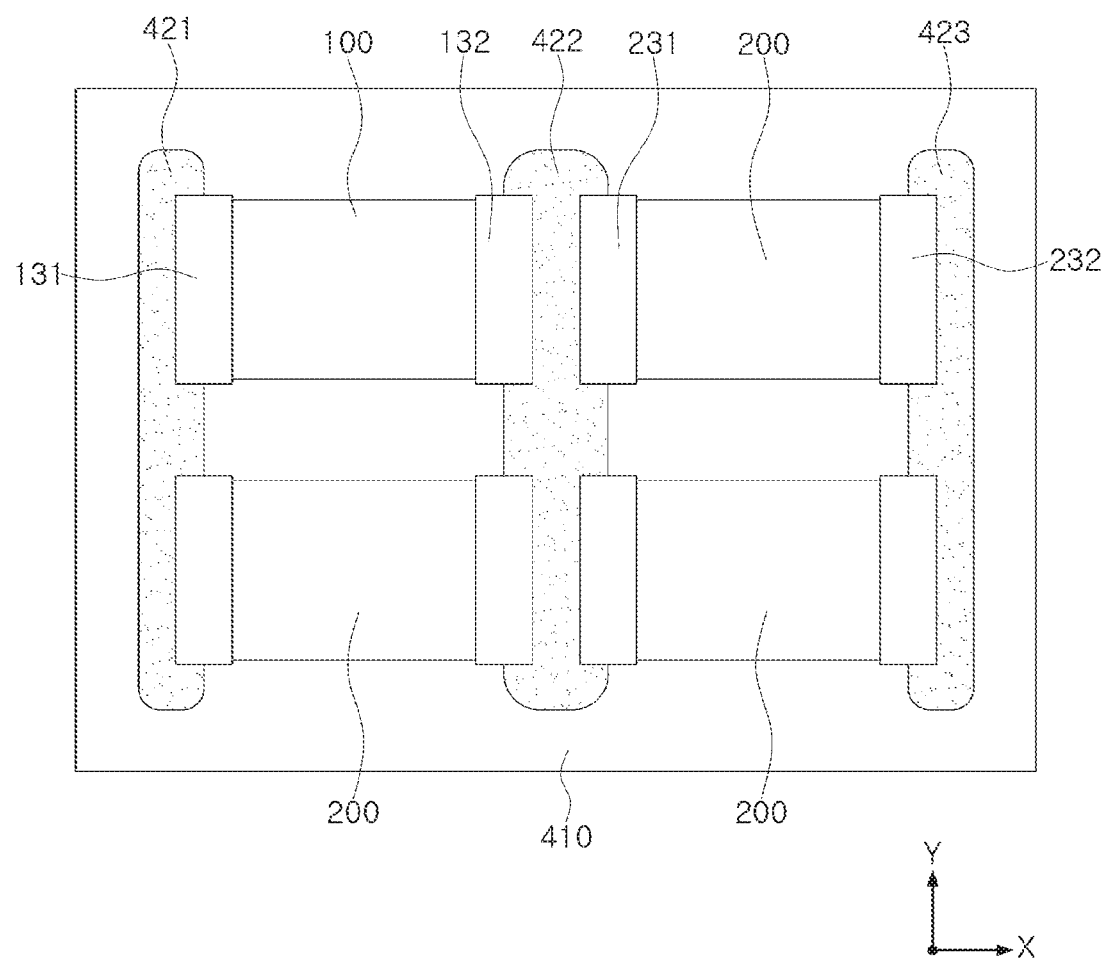
FIG. 16 is a perspective view illustrating a schematic structure of an electronic component according to another embodiment of the present disclosure.

FIG. 16 is a perspective view illustrating a schematic structure of an electronic component according to another embodiment of the present disclosure.

Here, since structures of the first multilayer capacitor 100 and the second multilayer capacitor 200 are similar to those of the above-described embodiment, a detailed description thereof is omitted in order to avoid duplication, and a substrate having a structure different from the above-described embodiment and a dispositional structure of the first and second multilayer capacitors will be described in detail based on this.

Referring to FIG. 16, the electronic component of the present embodiment may include four multilayer capacitors.

In addition, the electronic component may include a substrate 410 having third to fifth electrode pads 421, 422, and 423 disposed on one surface thereof in the X direction at predetermined intervals, and one first multilayer capacitor 100 having a horizontally stacked structure mounted on an upper surface of the substrate 410 and three second multilayer capacitors 200 having a vertically stacked structure.

In addition, the plurality of second multilayer capacitors 200 and first multilayer capacitors 100 may be disposed in an array of 2×2 and may be disposed in square form on the substrate 410.

In the present embodiment, one first multilayer capacitor 100 may be disposed on an upper left side in the drawing, and a total of three second multilayer capacitors 200 may be disposed on an upper right side and a lower side, respectively, to have square form as a whole.

In addition, the third to fifth electrode pads 421, 422, and 423 may be formed in line form, respectively.

In this case, the first external electrode 131 of the first multilayer capacitor 100 and the third external electrode 231 of the second multilayer capacitor 200 on the lower left side are disposed to be connected to the third electrode pad 421.

In this case, the second external electrode 132 of the first multilayer capacitor, the third external electrode 231 of the second multilayer capacitor 200 on the upper right side, the fourth external electrode 232 of the second multilayer capacitor 200 on the lower left side, and the third external electrode 231 of the second multilayer capacitor 200 on the lower right side are disposed to be connected to the fourth electrode pad 422.

The fourth external electrode 232 of the second multilayer capacitor 200 on the upper right side and the fourth external electrode 232 of the second multilayer capacitor 200 on the lower right side are disposed to be connected to the fifth electrode pad 423.

The electronic component of the present embodiment may be changed to various dispositional structures.

Figure 18:
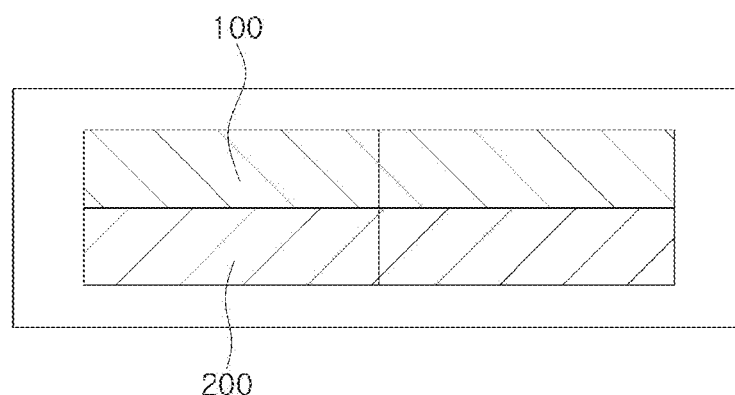
FIGS. 18 to 21 are schematic diagrams conceptually illustrating various embodiments of the electronic component of the present disclosure in which a plurality of multilayer capacitors are disposed in square form.

For example, as shown in FIG. 18, two first multilayer capacitors 100 may be disposed in an upper portion thereof, and two second multilayer capacitors 200 may be disposed in a lower portion thereof.

Figure 19:
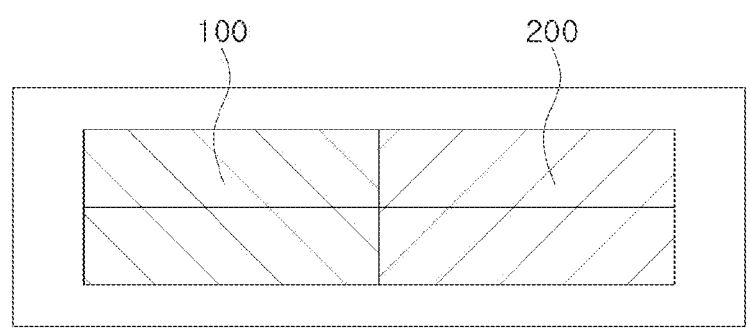

Alternatively, as shown in FIG. 19, two first multilayer capacitors 100 may be disposed on a left side, and two second multilayer capacitors 200 may be disposed on a right side.

Figure 20:
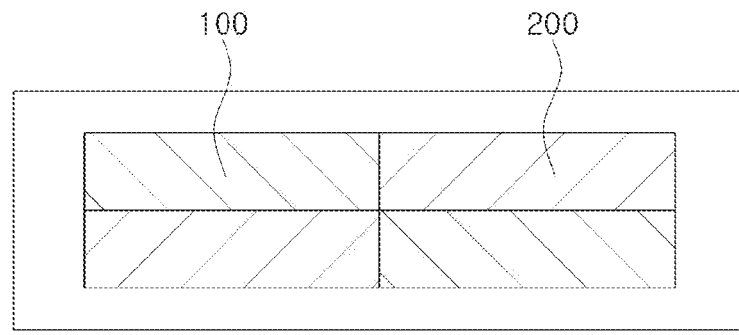

Alternatively, as shown in FIG. 20, the first multilayer capacitor 100 may be disposed on an upper left side and a lower right side, respectively, and the second multilayer capacitor 200 may be disposed on an upper right side and a lower left side, respectively.

Figure 21:
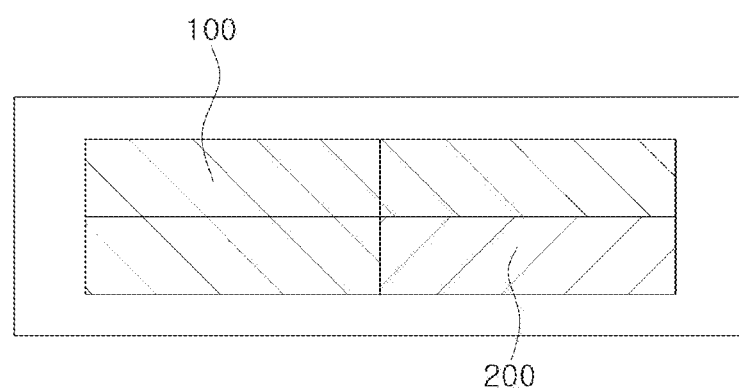

Alternatively, as shown in FIG. 21, the first multilayer capacitor 100 may be disposed on the upper left side, the upper right side, and the lower left side, respectively, and the second stacked capacitor 200 may be disposed on the lower right side.

Table 2 below shows a comparison between the acoustic noise of the Comparative Example and various Examples of the present disclosure.

Figure 17:
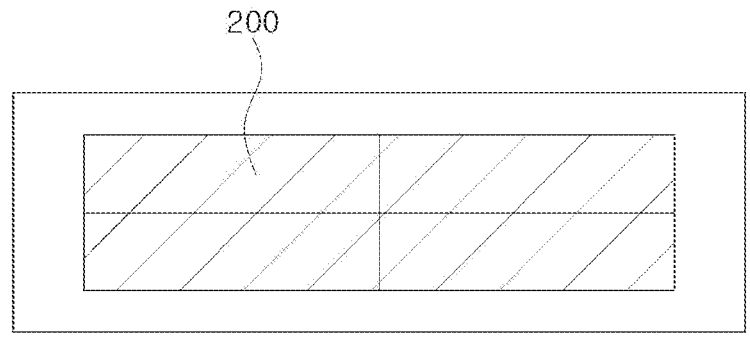
FIG. 17 is a schematic diagram conceptually illustrating an electronic component of Comparative Example in which a first multilayer capacitor having a plurality of vertically stacked structures is disposed in square form.
Figure 22:
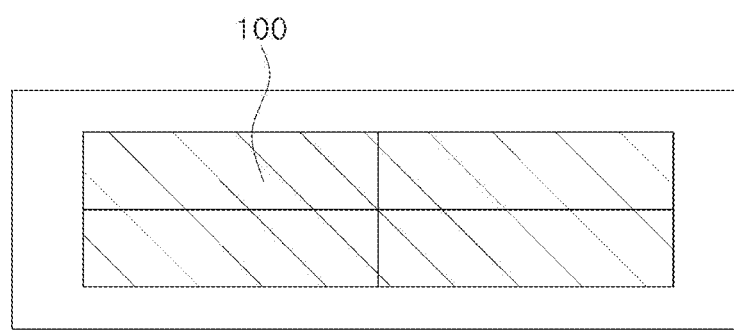
FIG. 22 is a schematic diagram conceptually illustrating the electronic component of Comparative Example in which a second multilayer capacitor of a plurality of horizontally stacked structures is disposed in square form.

Comparative Example 3 shows an electronic component composed only of the second multilayer capacitor having the vertically stacked structure shown in FIG. 17, and Comparative Example 4 shows an electronic component composed only of the first multilayer capacitor having the horizontally stacked structure shown in FIG. 22.

In addition, Example 9 shows a structure shown in FIG. 16, Example 10 shows a structure shown in FIG. 18, Example 11 shows a structure shown in FIG. 19, Example 12 shows a structure shown in FIG. 20, Example 13 shows a structure shown in FIG. 21, and Example 14 shows a structure shown in FIG. 22.

In Example 13 including three first multilayer capacitors having a horizontally stacked structure, an average value of acoustic noise was 37.3 dB.

In Example 13, the average value of the acoustic noise was lower than that of Comparative Example 4, but higher than Comparative Example 3.

As a result, in forming a rectangle-shaped electronic component using a plurality of multilayer capacitors, when both the first multilayer capacitor and the second multilayer capacitor are included, it can be seen that acoustic noise is reduced as compared to an electronic component only comprised of the second multilayer capacitor.

In this case, preferably, the number of the second multilayer capacitors may be greater than the number of the first multilayer capacitors.

Meanwhile, in the present disclosure, four multilayer capacitors may be disposed in a rectangle shape (e.g., an array of 2×2), but the electronic component may be configured in a structure comprised of three multilayer capacitors and one blank without mounting the multilayer capacitors in one of four compartments.

Meanwhile, in the present disclosure, four multilayer capacitors may be disposed in a square shape, but the electronic component may be configured in a structure

TABLE 2

| | Acoustic Noise (dB) | | | | | | | | |
|---|---|---|---|---|---|---|---|---|---|
| | Sample 1 | Sample 2 | Sample 3 | Sample 4 | Sample 5 | Average | Minimum | Maximum | Standard deviation |
| CE3 | 30.7 | 30.6 | 31.2 | 30 | 30.6 | 30.6 | 30 | 31.2 | 0.4 |
| CE4 | 40.5 | 40.5 | 40.6 | 40.9 | 40.3 | 40.6 | 40.3 | 40.9 | 0.2 |
| Example 9 | 17.9 | 19.1 | 18.3 | 19.8 | 18.5 | 18.7 | 17.9 | 19.8 | 0.7 |
| Example 10 | 31.8 | 31 | 31.5 | 31.3 | 31.4 | 31.4 | 31 | 31.8 | 0.3 |
| Example 11 | 31.7 | 32.2 | 31.8 | 31.7 | 32 | 31.9 | 31.7 | 32.2 | 0.2 |
| Example 12 | 31.6 | 31.8 | 32.1 | 31.1 | 31.2 | 31.6 | 31.1 | 32.1 | 0.4 |
| Example 13 | 37.4 | 37.2 | 37 | 37.6 | 37.2 | 37.3 | 37 | 37.6 | 0.2 |

*CE3 and CE4: Comparative Examples

Referring to Table 2, in Comparative Example 3, which shows an electronic component composed only of a second multilayer capacitor having a vertically stacked structure, an average value of acoustic noise was 30.6 dB.

In addition, in Comparative Example 4, which shows an electronic component composed only of a first multilayer capacitor having a horizontally stacked structure, an average value of acoustic noise was 40.6 dB, which is much higher than that of Comparative Example 3.

That is, in general, it can be seen that the first multilayer capacitor having the horizontally stacked structure has a higher piezoelectric vibration than the second multilayer capacitor having the vertically stacked structure, and thus the acoustic noise is also high.

In addition, in Example 9 including one first multilayer capacitor having the horizontally stacked structure, the average value of acoustic noise was 18.7 dB, which is lower than that of Comparative Example 2 as well as Comparative Example 1.

In Examples 10 to 12 including two first multilayer capacitors having the horizontally stacked structure, the average value of acoustic noise of Example 10 was 31.4 dB, and the average value of acoustic noise of Example 11 was 31.9 dB, and the average value of acoustic noise of Example 12 was 31.6 dB.

Accordingly, in Examples 10 to 12, the average value of acoustic noise was lower than that of Comparative Example 4, but higher than Comparative Example 3.

comprised of three multilayer capacitors and one blank without mounting the multilayer capacitors in one of four compartments.

In general, it is known that a multilayer capacitor having a vertically stacked structure generates less acoustic noise when mounted on a substrate than a multilayer capacitor having a horizontal mounting structure.

However, in the present embodiment, an electronic component is configured by including a substrate and a plurality of multilayer capacitors, at least one of the multilayer capacitors is configured as a multilayer capacitor having a horizontally stacked structure, and the remaining multilayer capacitors are multilayer capacitors having a vertically stacked structure.

Therefore, vibration generated in the multilayer capacitor having the horizontally stacked structure and the multilayer capacitor having the vertically stacked structure, adjacent to each other, may be reduced due to a physical wave offset effect and reduce an amount of piezoelectric vibrations of the multilayer capacitors being transferred to the substrate when mounted on the substrate. As a result, acoustic noise can be further reduced compared to an electronic component composed of only a plurality of multilayer capacitors having a vertically stacked structure.

In order to implement this acoustic noise reduction effect, a plurality of multilayer capacitors are preferably disposed in a line on the substrate, or four multilayer capacitors are disposed adjacent to each other on the substrate in square form.

As set forth above, according to an embodiment of the present disclosure, in an electronic component including a plurality of multilayer capacitors disposed adjacent to each other, at least one multilayer capacitor may be configured as a multilayer capacitor having a horizontally stacked type structure, such that acoustic noise in an audible frequency region of less than 20 kHz and high frequency vibration of 20 kHz or more of the electronic component may be reduced However, various and advantageous advantages and effects of the present disclosure are not limited to the above description, and will be more readily understood in the process of describing specific embodiments of the present disclosure.

While exemplary embodiments have been shown and described above, it will be apparent to those skilled in the art that modifications and variations could be made without departing from the spirit and scope of the present disclosure as defined by the appended claims.

What is claimed is:

1. An electronic component, comprising:
   a substrate including electrode pads disposed on an upper surface; and a plurality of multilayer capacitors mounted on the substrate and including external electrodes directly connected to the electrode pads,
   wherein at least one multilayer capacitor among the plurality of multilayer capacitors is a multilayer capacitor having a horizontally stacked structure,
   each of the plurality of multilayer capacitors comprises a body and the external electrodes respectively disposed on both ends of the body in a first direction,
   the body comprises a dielectric layer and the internal electrodes alternately disposed with the dielectric layer interposed therebetween, and
   the external electrodes comprise:
   first and second head portions disposed on both end surfaces of the body of the multilayer capacitor in the first direction, respectively; and
   first and second band portions extending from the first and second head portions onto portions of upper and lower surfaces and portions of both side surfaces of the body, respectively.

2. The electronic component of claim 1, wherein a total of four or more multilayer capacitors are included.

3. The electronic component of claim 1, wherein the plurality of multilayer capacitors are disposed adjacent to each other in a line on the substrate.

4. The electronic component of claim 3, wherein the number of the plurality of multilayer capacitors is a total of four.

5. The electronic component of claim 3, wherein one of two multilayer capacitors among the plurality of multilayer capacitors disposed on a center portion of the plurality of multilayer capacitors is a multilayer capacitor having the horizontally stacked structure.

6. The electronic component of claim 1, wherein the substrate provides spaces in a 1×4 array, and the plurality of multilayer capacitors are respectively disposed only in three compartments of the 1×4 array.

7. The electronic component of claim 1, wherein the number of the plurality of multilayer capacitors are a total of four, and the plurality of multilayer capacitors are disposed adjacent to each other in square form on the substrate.

8. The electronic component of claim 1, wherein the number of the plurality of multilayer capacitors are a total of four, and the plurality of multilayer capacitors are disposed adjacent to each other in rectangle form on the substrate.

9. The electronic component of claim 1, wherein the plurality of multilayer capacitors are disposed in a 2×2 array.

10. The electronic component of claim 1, wherein the number of multilayer capacitors among the plurality of multilayer capacitors having a vertically stacked structure is greater than the number of multilayer capacitors among the plurality of multilayer capacitors having the horizontally stacked type.

11. The electronic component of claim 10, wherein the horizontally stacked structure includes internal electrodes disposed horizontally with respect to the upper surface of the substrate and stacked on each other in a vertical direction with respect to the upper surface of the substrate, and
   the vertically stacked structure includes internal electrodes disposed vertically with respect to the upper surface of the substrate and stacked on each other in a horizontal direction with respect to the upper surface of the substrate.

12. The electronic component of claim 1, wherein the horizontally stacked structure includes internal electrodes disposed horizontally with respect to the upper surface of the substrate and stacked on each other in a vertical direction with respect to the upper surface of the substrate.

13. The electronic component of claim 1, wherein the number of the at least one multilayer capacitor having the horizontally stacked structure accounts for 75% or less of the number of the plurality of multilayer capacitors.

* * * * *